United States Patent
Zhang et al.

(10) Patent No.: US 10,964,843 B2
(45) Date of Patent: Mar. 30, 2021

(54) PATTERNED SI SUBSTRATE-BASED LED EPITAXIAL WAFER AND PREPARATION METHOD THEREFOR

(71) Applicant: ENKRIS SEMICONDUCTOR, INC, Jiangsu (CN)

(72) Inventors: Liyang Zhang, Jiangsu (CN); Kai Cheng, Jiangsu (CN)

(73) Assignee: ENKRIS SEMICONDUCTOR, INC, Jiangsu (CN)

(*) Notice: Subject to any disclaimer, the term of this patent is extended or adjusted under 35 U.S.C. 154(b) by 0 days.

(21) Appl. No.: 16/090,563

(22) PCT Filed: Mar. 28, 2017

(86) PCT No.: PCT/CN2017/078475
§ 371 (c)(1),
(2) Date: Oct. 1, 2018

(87) PCT Pub. No.: WO2017/167190
PCT Pub. Date: Oct. 5, 2017

(65) Prior Publication Data
US 2019/0148586 A1 May 16, 2019

(30) Foreign Application Priority Data
Mar. 29, 2016 (CN) .......................... 201610187818.8

(51) Int. Cl.
*H01L 33/12* (2010.01)
*H01L 33/44* (2010.01)
(Continued)

(52) U.S. Cl.
CPC ............ *H01L 33/12* (2013.01); *H01L 33/007* (2013.01); *H01L 33/0075* (2013.01);
(Continued)

(58) Field of Classification Search
CPC .................. H01L 33/20; H01L 33/22
See application file for complete search history.

(56) References Cited

U.S. PATENT DOCUMENTS

2001/0012678 A1   8/2001  Tanaka et al.
2008/0308835 A1*  12/2008  Pan ........................ B82Y 20/00
                                                  257/103

(Continued)

FOREIGN PATENT DOCUMENTS

CN    101145516 A    3/2008
CN    101471402 A    7/2009
(Continued)

OTHER PUBLICATIONS

Fenwick et al., MOCVD growth of GaN on Si(111) substrates using an ALD-grown Al2O3 interlayer, 2009, Journal of Crystal Growth 311, pp. 4306-4310 (Year: 2009).*

(Continued)

*Primary Examiner* — Daniel Whalen
(74) *Attorney, Agent, or Firm* — Masuvalley & Partners (57) ABSTRACT

An patterned Si substrate-based LED epitaxial wafer and a preparation method therefor, the LED epitaxial wafer comprising: a patterned Si substrate (1) and an $Al_2O_3$ coating (2) growing on the patterned Si substrate (1); sequentially growing on the $Al_2O_3$ coating (2) are a nucleating layer (3), a first buffer layer (4), a first insertion layer (5), a second buffer layer (6), a second insertion layer (7), an n-GaN layer (8), a quantum well layer (9), a p-GaN layer (10), an n-electrode (14) electrically connected to the n-GaN layer and a p-electrode (13) electrically connected to the p-GaN layer. The present invention is suitable for the preparation of large-sized LED epitaxial wafers. Furthermore, the crystal quality is improved, and the light extraction efficiency of the LED die is improved.

3 Claims, 10 Drawing Sheets

(51) Int. Cl.
*H01L 33/00* (2010.01)
*H01L 33/22* (2010.01)
*H01L 33/18* (2010.01)
*H01L 33/02* (2010.01)
*H01L 33/20* (2010.01)

(52) U.S. Cl.
CPC .............. *H01L 33/18* (2013.01); *H01L 33/22* (2013.01); *H01L 33/44* (2013.01); *H01L 33/025* (2013.01); *H01L 33/20* (2013.01); *H01L 2933/0025* (2013.01)

(56) References Cited

U.S. PATENT DOCUMENTS

| | | | |
|---|---|---|---|
| 2013/0146863 | A1 | 6/2013 | Ramdani et al. |
| 2014/0299885 | A1* | 10/2014 | Lee .................. H01L 29/20 257/76 |
| 2016/0108552 | A1 | 4/2016 | Kuraoka et al. |

FOREIGN PATENT DOCUMENTS

| | | |
|---|---|---|
| CN | 101728244 A | 6/2010 |
| CN | 102723416 A | 10/2012 |
| CN | 103035496 A | 4/2013 |
| CN | 103035794 A | 4/2013 |
| CN | 203910840 U | 10/2014 |
| CN | 104593727 A | 5/2015 |
| CN | 105591004 A | 5/2016 |
| TW | 201520357 A | 6/2015 |
| TW | 201539752 A | 10/2015 |

OTHER PUBLICATIONS

ISA/CN, International Search Report dated Jun. 30, 2017 in International Application No. PCT/CN2017/078475, total 4 pages with English translation.
Chinese 5th Office Action dated Nov. 22, 2019, Chinese Patent Application No. 201610187818.8, 15 Pages.
Taiwanese Office Action dated Jul. 21, 2020, Taiwanese Patent Application No. 106108297, 4 pages.
Taiwanese Office Action dated Apr. 28, 2020, Taiwanese Patent Application No. 106108297, 4 pages.
Taiwanese Search Report dated Apr. 28, 2020, Taiwanese Patent Application No. 106108297, 1 page.

* cited by examiner

Cross-sectional View

Fig. 2B

Cross-sectional View

Fig. 2C

Cross-sectional View

Fig. 2D

Top View

Fig. 2E

Top View

Fig. 2F

Top View

Fig. 2G

Top View

PATTERNED SI SUBSTRATE-BASED LED EPITAXIAL WAFER AND PREPARATION METHOD THEREFOR

The present application claims priority to Chinese Patent Application No. CN201610187818.8, entitled "PATTERNED SI SUBSTRATE-BASED LED EPITAXIAL WAFER AND PREPARATION METHOD THEREFOR", filed on Mar. 29, 2016, all of which is incorporated herein by reference.

FIELD OF THE INVENTION

The invention relates to the field of LED epitaxy and particularly relates to a patterned Si substrate-based LED epitaxial wafer and preparation method therefor.

BACKGROUND OF THE INVENTION

Band gap of GaN-based III-V compound semiconductor materials (AlN, GaN, InN, and ternary or quaternary alloy materials composed of them) can be continuously adjustable from 0.7 eV to 6.2 eV at room temperature, and the color covers the entire visible light band and a part of infrared, ultraviolet band, which has a wide range of applications and developments in optoelectronic devices such as lasers (LDs), light-emitting diodes (LEDs), full-spectrum solar cells and detectors. In 1989, Akasaki and Amono successfully produced p-n junction GaN blue light-emitting diodes for the first time. By 1994, Nakamura et al. from Nichia Corporation, Japan, realized the industrialization of InGaN/GaN heterojunction blue LEDs, and since then, GaN-based LED optoelectronic devices have been widely used in backlight, illumination, display and other fields.

In the past 20 years, researchers have continuously explored and improved the GaN epitaxial growth technology, but it is difficult to prepare the GaN bulk material which is the most ideal homogenous substrate for growing GaN epitaxial layer (because GaN has a high melting point (2800° C.) and equilibrium vapor pressure (4.5 GPa) is large); therefore, epitaxial growth of GaN is mostly performed on a heterogeneous substrate. The substrates most commonly used to grow GaN-based device materials are sapphire, SiC, and Si. Among these three substrates, the sapphire substrate has become the mainstream technology in the LED industry, due to its low price and stable quality, as well as the greatly improved the light extraction efficiency due to the use of patterned sapphire substrates. However, the sapphire has a low thermal conductivity so that making it difficult to dissipate heat, which also seriously restricts the development of high-power LEDs using sapphire substrates. SiC substrate has excellent thermal conductivity (4.49 W/cm·K), and its lattice mismatch with GaN is only 3.5%, however due to its high price and small substrate size, it is difficult to reduce the cost, and can only be used in high-end applications. The Si substrate has the advantages of low price, large size, high crystal quality, high thermal conductivity, etc., and the Si-based device technology is very mature. The Si device process can maturely perform the steps of shear-thinning, flip-chipping, and packaging for the device to improve the operational stability of the device. However, the main problem with epitaxially growing GaN on a Si substrate is the presence of large stress in the GaN-on-Si epitaxial film, which causes surface cracking problems. In addition, when a GaN epitaxial material is grown on a Si substrate, if not treated, the Si substrate may react with Ga atoms in the atmosphere of ammonia ($NH_3$) (referred to as a "melt-back reaction"), causing a large amount of surface defects, unable to produce the device. To solve this problem, the MOCVD reaction chamber needs to be carefully cleaned to remove the background of the Ga atoms, and it is necessary to first grow an AlN nucleation layer before growing the GaN material, thereby avoiding the melt-back reaction.

In addition to improving the crystal quality of the grown GaN epitaxial film and improving the internal quantum effect, the improvement of LED efficiency requires optimization of the light extraction efficiency. There are two main ways to improve the LED light extraction efficiency, one is the surface roughening technology of the LED epitaxial wafer, which increases the amount of light emitted from the surface; and the other is to prepare the LED epitaxial wafer on the patterned Sapphire Substrate (PSS), so that to increase the light reflected from the bottom by using the bottom of the patterned substrate. For LEDs on conventional Si substrates, it is necessary to perform a flip-chipping process, and to completely strip the Si substrate, because Si material is completely opaque at a blue wavelength. After the Si substrate is stripped off, it is necessary to roughen the AlN nucleation layer on the back surface, so that the light extraction efficiency can be improved. Surface roughening on N surfaces of AlN nucleation layers can be carried out by a dry or wet process, but each of the fabrication process is relatively difficult, the rate of dry etching for AlN is slow, and wet etching requires a higher temperature.

The preparation of a pattern structure on the Si substrate is relatively mature and simpler. However, when preparing a GaN LED structure directly on a patterned Si substrate, it is usually necessary to use an AlN nucleation layer to avoid the meltback etching between Si and Ga atoms. When AlN is deposited on a Si substrate, it can be attached to various directions of the patterned Si substrate, and it is impossible to prepare a single crystal GaN epitaxial material.

SUMMARY OF THE INVENTION

An object of the present invention is to overcome the deficiencies of the prior art and to provide a patterned Si substrate-based LED epitaxial wafer with an $Al_2O_3$ coating, which has excellent electrical and optical properties, and a method of preparing the LED epitaxial wafer.

The technical solution provided by the embodiment of the present invention is as follows:

A patterned Si substrate-based LED epitaxial wafer, the LED epitaxial wafer includes:

a patterned Si substrate;

an $Al_2O_3$ coating, which is configured to be grown on the patterned Si substrate; and an epitaxial layer, which is configured to be grown on the $Al_2O_3$ coating.

As a further improvement of the present invention, the Si substrate is a patterned Si (111) crystal face or Si (100) crystal face or Si (110) crystal face, and the doping type is n-type or p-type.

As a further improvement of the present invention, the epitaxial layer includes a GaN or AlGaN nucleation layer grown on the $Al_2O_3$ coating.

As a further improvement of the present invention, the epitaxial layer includes a first GaN buffer layer and a light emitting structure layer sequentially grown on the nucleation layer.

As a further improvement of the present invention, the epitaxial layer further includes a stress buffer layer between the first GaN buffer layer and the light emitting structure layer.

Correspondingly, a preparation method for a patterned Si substrate-based LED epitaxial wafer is provided, the preparation method includes S1, etching a patterned structure on a Si substrate to form a patterned Si substrate;

S2, growing an $Al_2O_3$ coating on the patterned Si substrate; and

S3, growing an epitaxial layer on the $Al_2O_3$ coating.

As a further improvement of the present invention, the epitaxial layer includes a GaN or AlGaN nucleation layer grown on the $Al_2O_3$ coating.

As a further improvement of the present invention, the epitaxial layer further includes a first buffer layer and a light emitting structure layer sequentially grown on the GaN or AlGaN nucleation layer, and the preparation method further includes:

preparing an n-electrode electrically connected to the n-GaN layer, and a p-electrode electrically connected to the p-GaN layer;

using the $Al_2O_3$ coating as a barrier layer to etch off the patterned Si substrate by wet etching and expose the patterned $Al_2O_3$ coating.

As a further improvement of the present invention, the preparation method further includes growing a stress buffer layer, and then epitaxially growing the light emitting structure layer after growing the first GaN buffer layer on the GaN or AlGaN nucleation layer.

As a further improvement of the present invention, the step S2 includes plating an Al layer on the patterned Si substrate, and then introducing oxygen ions to form the $Al_2O_3$ coating.

The beneficial effects of the invention are described as following:

1. The core of the present invention is the preparation of high quality LED epitaxial materials and devices on patterned Si substrates having $Al_2O_3$ coatings. It can be known from the foregoing that in order to avoid melt-back reaction, the structure of LED device prepared on the Si substrate must grow an AlN as a nucleation layer first, and then a GaN epitaxial layer is grown thereon, but AlN has no selectivity when grown on a Si substrate, and can grow simultaneously on the sidewall, the top, and the bottom, and its growth mode tends to be in a columnar growth mode, resulting in a non-uniform crystal orientation, which cannot grow a flat GaN single crystal epitaxial film. In addition, the problem of AlN crystal walls is generated when grown on a patterned Si substrate without $Al_2O_3$ coating, resulting in that a gap exists in the GaN layer, or a thick GaN layer is required in order to be completely combined; and an AlN nucleation layer can be grown on any crystal face, and it is even possible to use AlN as a nucleation layer to form a polycrystalline epitaxial film. If $Al_2O_3$ is used as a coating, the Si substrate can be effectively protected, and the melt-back reaction is avoided, and the GaN nucleation layer can be directly used to realize single crystal growth. The growth rate of GaN is the fastest in (0002) direction, and the growth rate in other directions is suppressed by the growth in the (0002) direction, thereby solving the problem that the GaN crystal grains cannot be effectively combined. In this way, a large-sized Si substrate GaN-based LED epitaxial wafer can be prepared, which provides a guarantee for developing a high-power Si substrate GaN-based LED device and reducing the price of the LED.

2. The present invention employs a patterned silicon substrate which is easier to fabricate various types of patterns on a Si substrate than the patterned sapphire substrate currently used in the LED industry, and the size and style selection of patterns are also more than that of the sapphire substrate; in addition, the patterned Si substrate has the following advantages: on one hand, the dislocation density of the GaN epitaxial material can be effectively reduced, thereby reducing the non-radiative recombination of active regions, reducing reverse leakage current, and increasing the lifetime of LED; on the other hand, the light emitted by the active regions is scattered multiple times by GaN and substrate interfaces, changing the exit angle of the total reflected light, increasing the probability that the flip-chipped LED light will exit the substrate, thereby improving the efficiency of light extraction. Compared with a Si substrate LED with a flat structure, the use of the patterned Si substrate can reduce the difficulty of the process for back surface roughening, that is because the patterned Si substrate can be used to transfer patterns into an epitaxial structure without roughing them in the GaN epitaxial film again.

3. Adding a stress buffer layer to the entire LED device structure solves the problem of surface cracking of the epitaxial layer which is caused by a tensile stress caused by the Si substrate when the temperature of GaN epitaxial layer is dropped down.

BRIEF DESCRIPTION OF THE DRAWINGS

To more clearly illustrate the embodiments of the present invention or the technical solutions in the prior art, the drawings used in the description for the embodiments or the prior art will be briefly described below. Obviously, the drawings in the following description are only for some of the embodiments described in the present invention, and those skilled in the art can obtain other drawings based on these drawings without any creative work.

FIG. 1~FIG. 11 are process flow diagrams of a method for preparing an LED device with a patterned Si substrate according to an embodiment of the present invention, wherein:

DETAILED DESCRIPTION OF THE EMBODIMENTS

The invention will be described in detail below in conjunction with the specific embodiments shown in the drawings. However, the embodiments are not intended to limit the invention, and the structures, methods, or functional changes made by those skilled in the art in accordance with the embodiments are included in the scope of the present invention.

Figure 1:
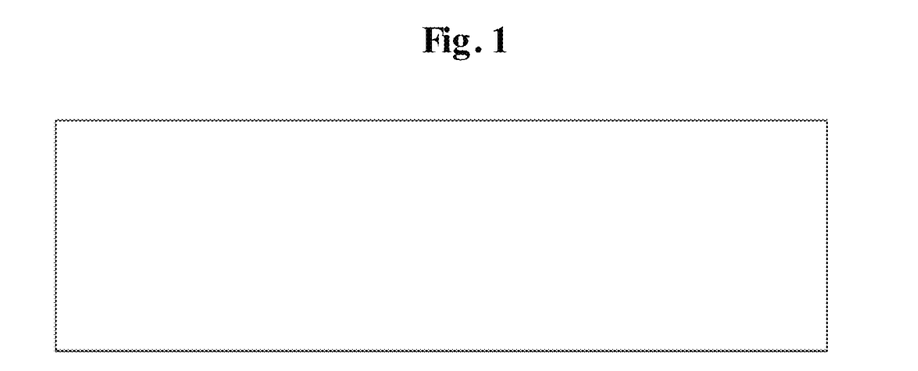
FIG. 1 is a schematic view of a Si (111) substrate.
Figure 2A:
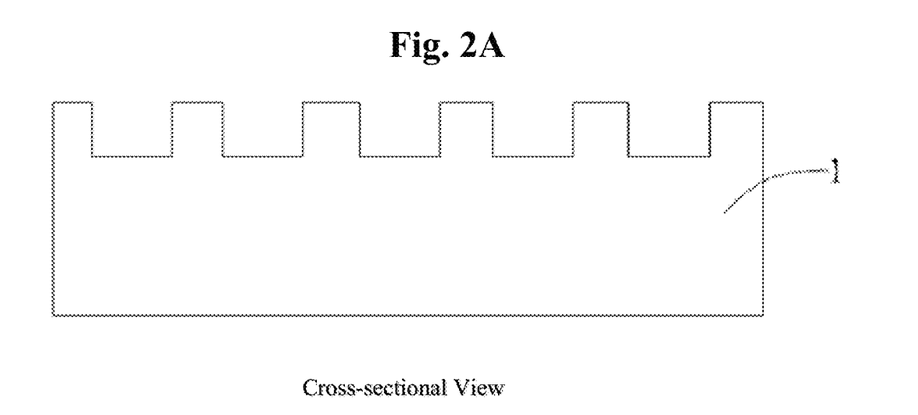
FIG. 2A to 2G are schematic views showing the formation of a patterned Si substrate on the Si (111) substrate.
Figure 2B:
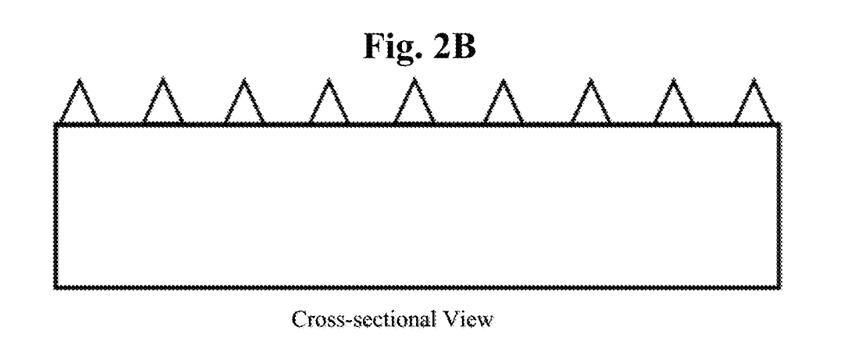
Figure 2C:
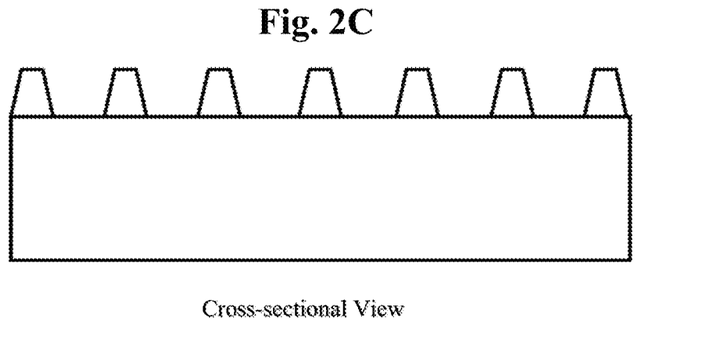
Figure 2D:
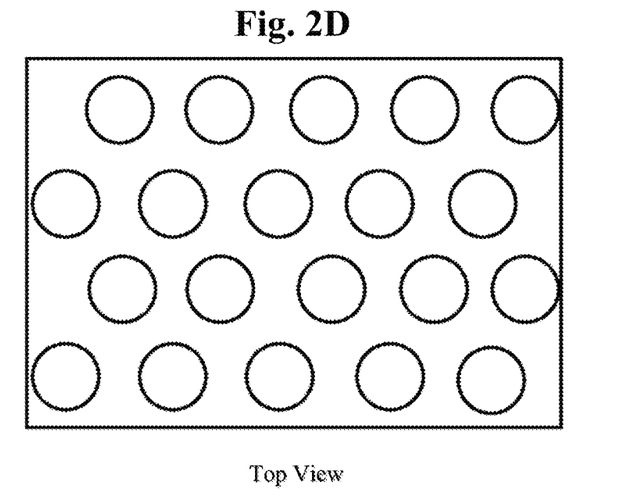
Figure 2E:
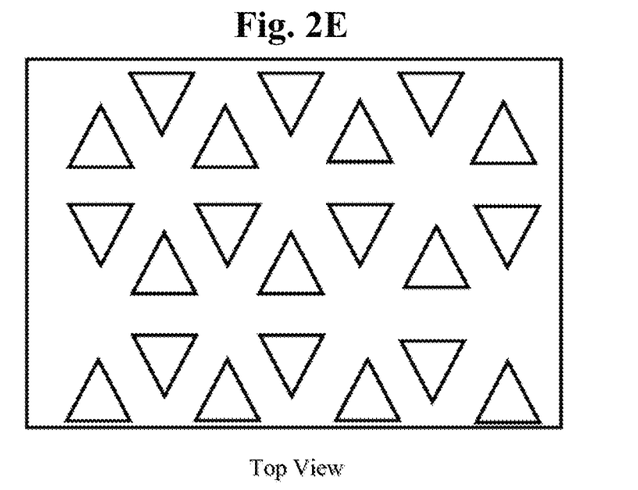
Figure 2F:
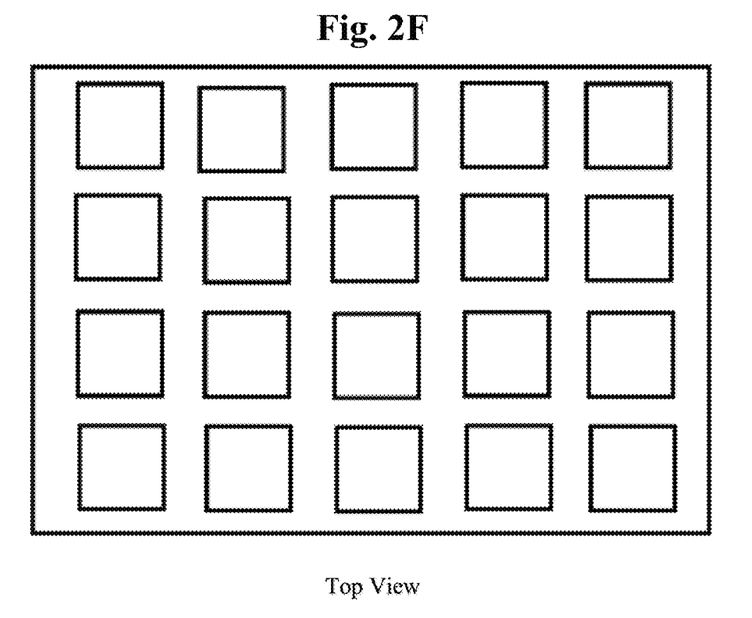
Figure 2G:
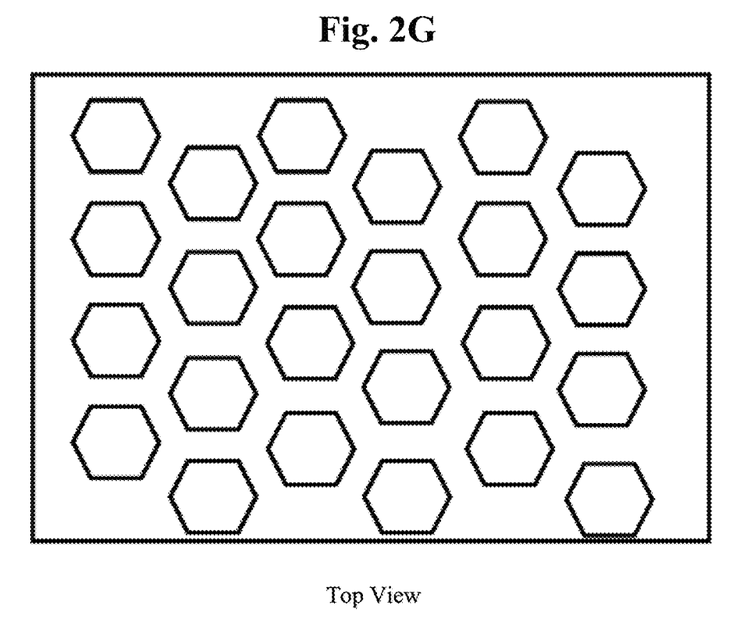

Referring to FIG. 1 to FIG. 11, the method for preparing a patterned Si substrate-based LED epitaxial wafer in the embodiment specifically includes the following steps:

(1) Preparing a flat Si substrate (as shown in FIG. 1), first etching a patterned structure on a flat Si substrate (shown in FIG. 1) to prepare a patterned silicon substrate (PSS) 1. Preferably, the present invention can optionally etch the patterned structure by dry etching.

The Si substrate is a Si (111) crystal face or a Si (100) crystal face or a Si (110) crystal face, and the doping type is n-type or p-type.

In the present invention, the patterned structure etched on the Si substrate is not particularly limited, and a corresponding patterned structure can be produced according to design requirements.

Referring to the cross-sectional views and the top views shown in FIG. 2A to FIG. 2G, the patterned structures which can be fabricated on the silicon substrate are various, and only some commonly used pattern structures are listed here, but the present invention is not limited thereto.

On the one hand, the patterned Si substrate can effectively reduce the dislocation density in GaN epitaxial material, improve the crystal quality of epitaxial layer, thereby reducing the non-radiative recombination of active region, reducing the reverse leakage current, and improving the lifetime of the LED; on the other hand, the light emitted by the active region is scattered multiple times by the interfaces between GaN and $Al_2O_3$ coatings, which changes the exit angle of the total reflected light, and increases the probability that the light of a flip-chipped LED is emitted from the $Al_2O_3$ coating, thereby improving the light extraction efficiency.

Figure 3:
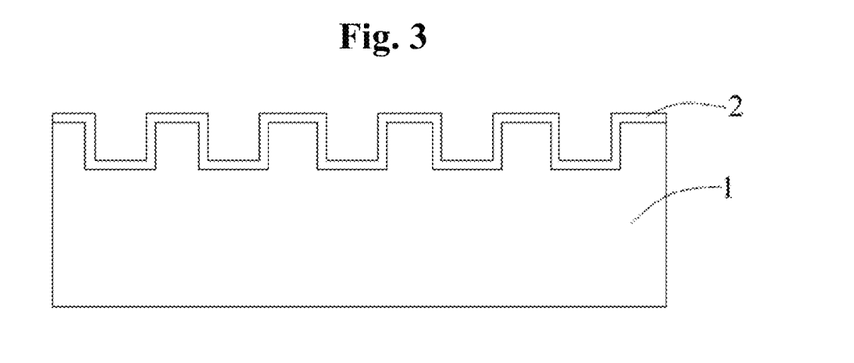
FIG. 3 is a schematic view showing a step of growing an $Al_2O_3$ coating on the patterned Si substrate.

(2) Referring to FIG. 3, an $Al_2O_3$ coating is grown by molecular beam epitaxy (MBE). Specifically, the patterned Si substrate 1 is first plated with an Al layer having a thickness of 1 nm to 200 nm, and then, an oxygen plasma is introduced to form an $Al_2O_3$ coating.

In order to avoid melt-back reaction, the LED device structure prepared on the Si substrate must first grow AlN as a nucleation layer, and then grow a GaN epitaxial layer thereon, but the AlN growth mode tends to be in a columnar growth mode, the problem of AlN crystal walls is generated when the layer is patterned on the Si substrate without $Al_2O_3$ coating, resulting in that a gap exists in the GaN layer, or a thick GaN layer is required in order to be completely combined; and an AlN nucleation layer can be grown on any crystal face, and it is even possible to form a polycrystalline epitaxial film using AlN as a nucleation layer. If $Al_2O_3$ is used as a coating, the Si substrate can be effectively protected, and the melt-back reaction is avoided, and the GaN nucleation layer can be directly used to realize single crystal growth. The growth rate of GaN is the fastest in (0002) direction, and the growth rate in other directions is suppressed by the growth in the (0002) direction, thereby solving the problem that the GaN crystal grains cannot be effectively combined. In this way, a large-sized Si substrate GaN-based LED can be prepared, which provides a guarantee for developing a high-power Si substrate GaN-based LED device and reducing the price of LED.

Figure 4A:
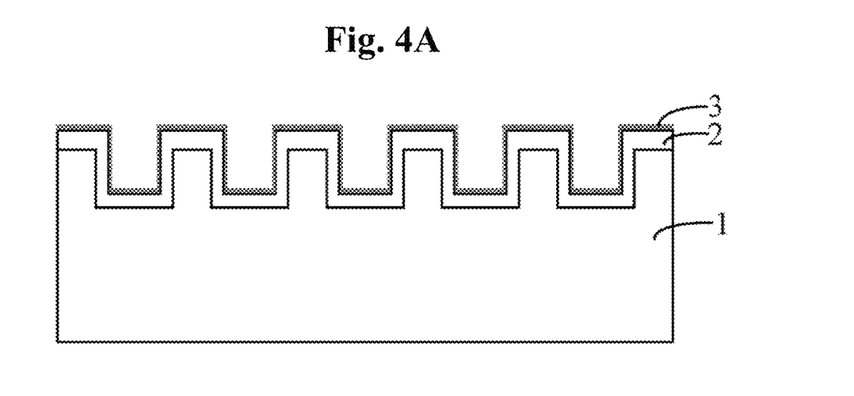
FIG. 4A and FIG. 4B are schematic views of epitaxial growth of a nucleation layer on the $Al_2O_3$ coating.
Figure 4B:
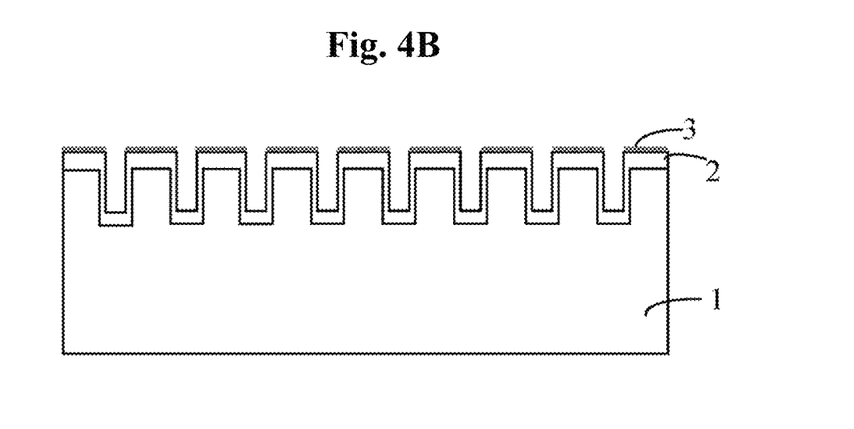

(3) A nucleation layer 3 is grown on the $Al_2O_3$ coating as shown in FIGS. 4A and 4B. FIG. 4A shows that when the width of a groove of the patterned structure on the Si substrate is large, the nucleation layer 3 can be grown onto the inner wall and the bottom of the groove. However, if the width of the groove of the patterned structure on the Si substrate is small, so that atoms cannot enter, as shown in FIG. 4B, the nucleation layer 3 cannot be grown on the inner wall and the bottom of the groove.

In the present invention, the nucleation layer 3 may preferably be AlGaN or GaN.

Figure 5A:
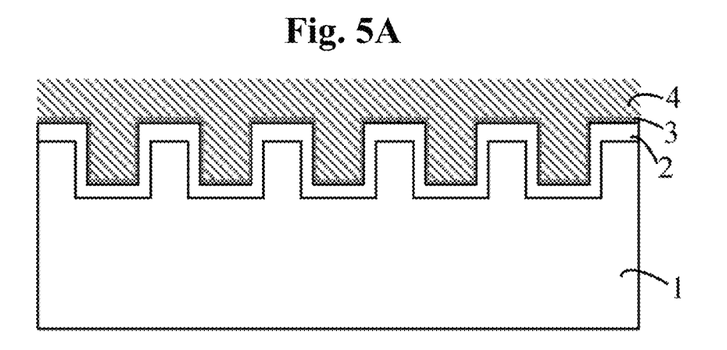
FIG. 5A and FIG. 5B are schematic views showing epitaxial growth of a first buffer layer on the nucleation layer.
Figure 5B:
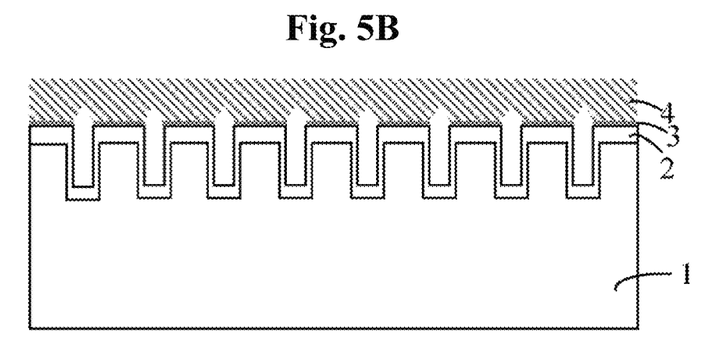

(4) As shown in FIGS. 5a and 5b, a first buffer layer 4 having a thickness of 100 nm to 5000 nm is epitaxially grown on the nucleation layer 3 by MOCVD. The first buffer layer 4 is preferably GaN.

FIG. 5A corresponds to FIG. 4A. When the groove of the patterned structure is wide, the first buffer layer 4 can be grown onto the side wall and bottom of the groove.

FIG. 5B corresponds to FIG. 4B. When the groove of the patterned structure is narrow, the first GaN buffer layer 4 cannot grow onto the sidewall and bottom of the groove, and the first GaN buffer layer 4 cannot grow onto the portion close to the groove opening.

Figure 6:
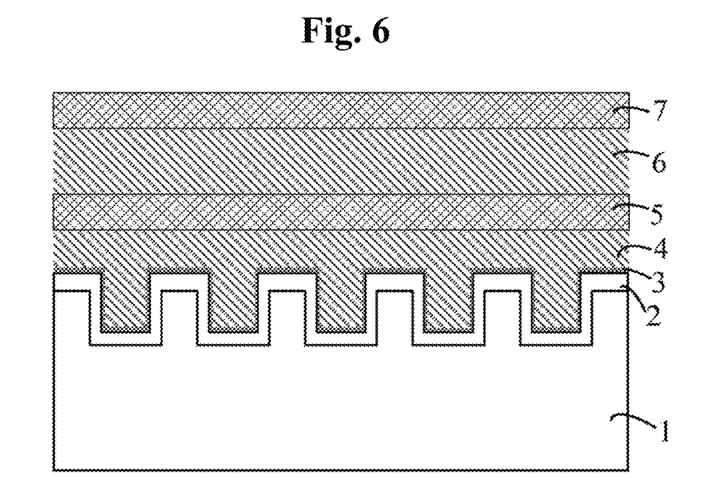
FIG. 6 is a schematic view showing epitaxial growth of a stress buffer layer on the first buffer layer.

(5) Referring to FIG. 6, a stress buffer layer is epitaxially grown on the first GaN buffer layer 4 by the MOCVD method. The stress buffer layer can act to regulate stress.

In the present invention, preferably, the stress buffer layer is composed of a first interposer layer 5, a second buffer layer 6, and a second insertion layer 7. However, the present invention is not limited thereto, and the stress buffer layer may be composed of three insertion layers and two buffer layers alternately, or more insertion layers and more buffer layers alternately.

In the present invention, preferably, the first insertion layer 5 and the second insertion layer 7 may be any one of an AlGaN insertion layer, an AlN insertion layer, or a superlattice insertion layer.

The first interposer layer 5 and the second interposer layer 7 have a thickness of 5 nm to 100 nm, and the second buffer layer 6 has a thickness of 100 nm to 5000 nm.

Figure 7:
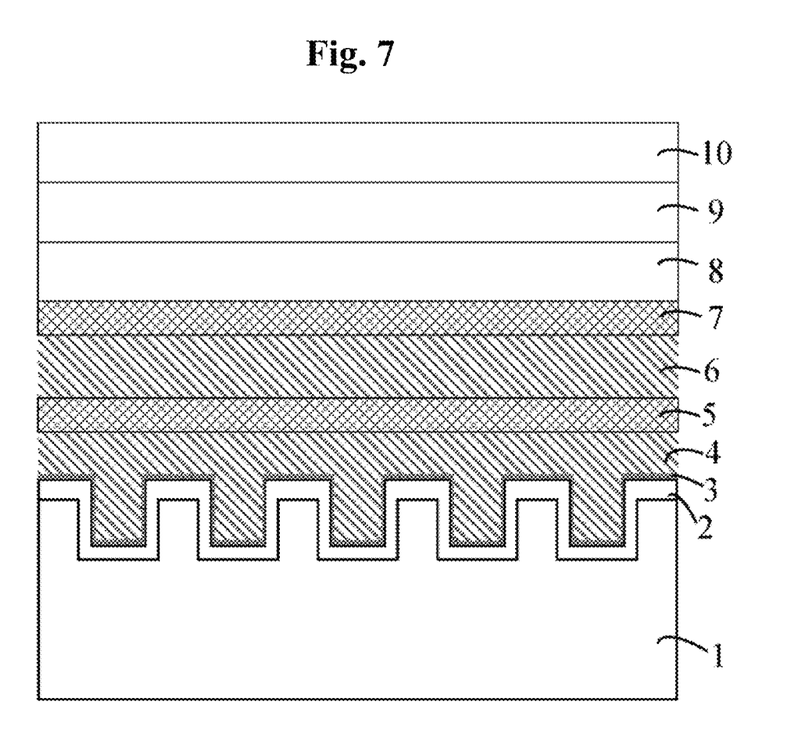
FIG. 7 is a schematic view showing epitaxial growth of a light emitting structure on the stress buffer layer.

(6) Referring to FIG. 7, the light emitting structure layer is epitaxially grown on the stress buffer layer by the MOVCD method. In the present invention, preferably, the light emitting structure layer is an n-GaN layer 8 of 1 μm to 5 μm, a quantum well layer 9 with multilayer structure, and a P—GaN layer 10 of 0.1 μm to 2 μm.

Figure 8:
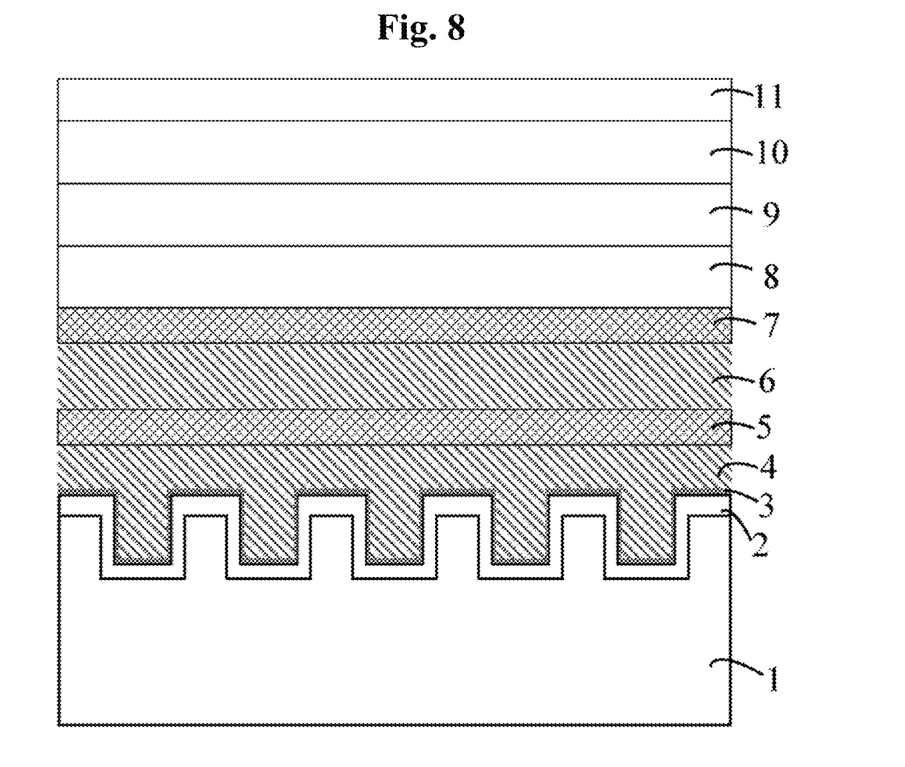
FIG. 8 is a schematic view showing deposition of a metal layer with a soldering surface on the light emitting structure.

(7) Referring to FIG. 8, a welded mirror metal layer 11 is coated on the p-GaN layer by sputtering, metal evaporation or electroplating, which is a silver or magnesium plated aluminum plate or nickel plate, the aluminum plate or nickel plate is bonded to the p-GaN layer 9 to form an ohmic contact.

Figure 9:
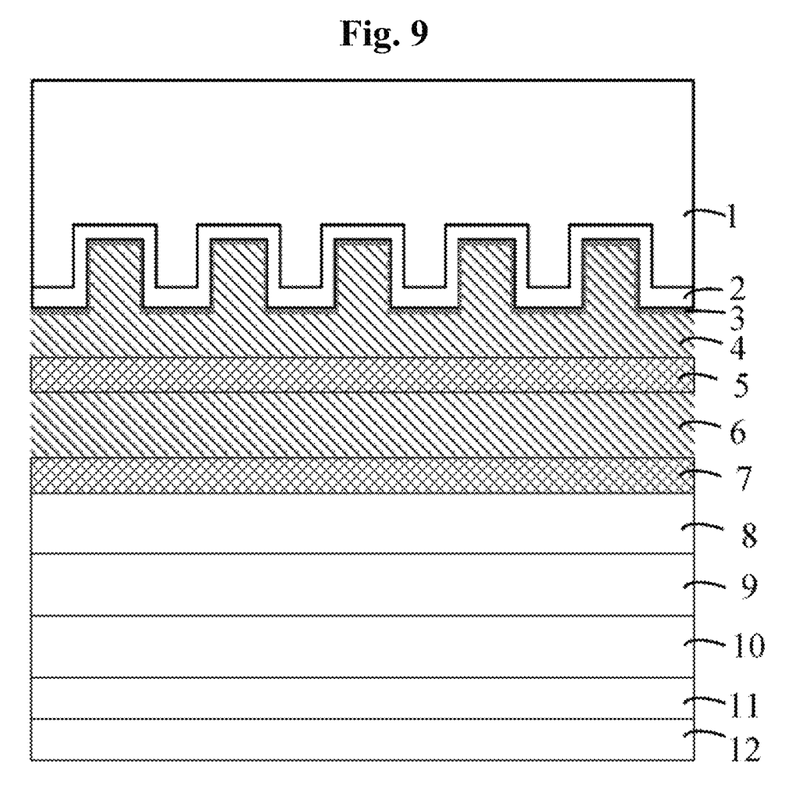
FIG. 9 is a schematic view of transferring an LED epitaxial wafer onto a Si (100) substrate by soldering a mirror metal layer.

(8) Referring to FIG. 9, the epitaxial layer is transferred to a new low-resistance double-side-polished Si substrate 12 through a solder metal layer, and a flip-chipping process is used to cause the welded mirror metal layer 11 to reflect light and to emit light from the $Al_2O_3$ coating.

Figure 10:
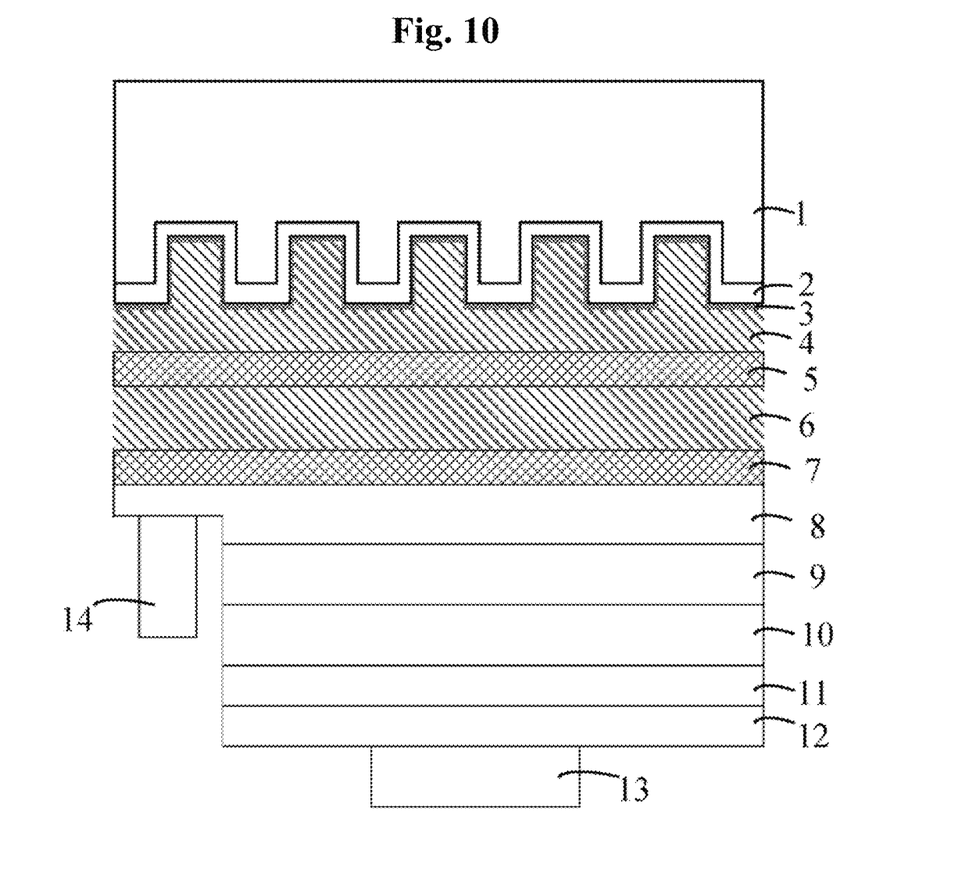
FIG. 10 is a schematic view showing an ohmic contact p-electrode fabricated on the Si (100) substrate and an ohmic contact n-electrode fabricated on an n-GaN layer.

(9) Referring to FIG. 10, an ohmic contact p-electrode 13 is formed on the Si substrate 12.

Etching is performed from the Si substrate 12 by dry etching until the n-GaN layer 8 is exposed, and a transparent electrode is plated on the exposed n-GaN layer 8, and gold or nickel is sputtered on the transparent electrode and etched into an electrode pattern to form an ohmic contact n-electrode 14.

Figure 11:
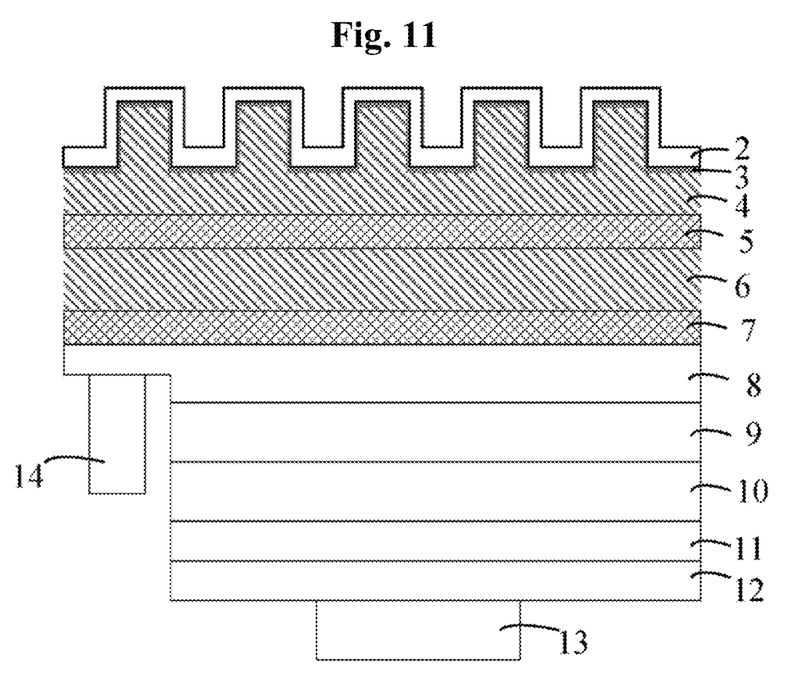
FIG. 11 is a schematic illustration of the removal of the patterned Si substrate.

(10) Referring to FIG. 11, using the $Al_2O_3$ coating as a barrier layer, the patterned Si substrate 1 is removed by wet etching to expose a patterned $Al_2O_3$ coating to form an LED device.

Compared with the prior art, the beneficial effects of the present invention are:

1. The present invention employs a patterned silicon substrate which is easier to fabricate various types of patterns on a Si substrate than a patterned sapphire substrate currently used in the LED industry, and the size and style selection of patterns are also more than that of the sapphire substrate; in addition, the patterned Si substrate has the following advantages: on one hand, the dislocation density of the GaN epitaxial material can be effectively reduced, thereby reducing the non-radiative recombination of active regions, and reducing the reverse leakage current, and increasing the lifetime of LED; on the other hand, the light emitted by the active regions is scattered multiple times by GaN and substrate interfaces, changing the exit angle of the total reflected light, increasing the probability that the flip-chipped LED light will exit the substrate, thereby improving the efficiency of light extraction.

2. The present invention employs an $Al_2O_3$ coating on a patterned silicon substrate and then directly grows a GaN or AlGaN nucleation layer. It is necessary for the LED device structure on a conventional Si substrate to first grow AlN as a nucleation layer, and then grow a GaN epitaxial layer thereon, but the AlN growth mode tends to be in a columnar growth mode, the problem of AlN crystal walls is generated when the layer is patterned on a PSS substrate, resulting in a gap exists in the GaN layer, or a thick GaN layer required in order to be completely combined. If GaN or AlGaN is used as the nucleation layer, the problem that GaN crystal grains cannot be effectively combined can be solved. In this way, a large-sized Si substrate GaN-based LED epitaxial wafer can be prepared, which provides a guarantee for developing a high-power Si substrate GaN-based LED device and reducing the price of LED.

3. Adding a stress buffer layer to the entire LED device structure solves the problem of surface cracking of the epitaxial layer which is caused by the tensile stress caused by the Si substrate when the GaN epitaxial layer is cooled.

It is obvious to those skilled in the art that the present invention is not limited to the details of the above-described exemplary embodiments, and the present invention can be embodied in other specific forms without departing from the spirit or essential characteristics of the invention. Therefore, the embodiments should be considered as exemplary and not limiting in any way, and the scope of the invention is defined by the appended claims rather than the description. Therefore, all changes that come within the meaning and range of equivalents of the claims are intended to be included in the invention. Any reference signs in the claims should not be construed as limiting the claim.

In addition, it should be understood that, although the description is described in terms of embodiments, not every embodiment includes only one independent technical solution. The description of the specification is merely for the sake of clarity, and those skilled in the art should regard the specification. The technical solutions in the respective embodiments may also be combined as appropriate to form other embodiments that can be understood by those skilled in the art.

The invention claimed is:

1. A preparation method for a patterned Si substrate-based LED epitaxial wafer, characterized in that the preparation method comprising the steps of:
   S1, etching a Si substrate to form a patterned Si substrate with a patterned structure thereon;
   S2, growing an $Al_2O_3$ coating on the patterned Si substrate; and
   S3, growing an epitaxial layer on the $Al_2O_3$ coating,
   wherein the epitaxial layer further comprises a GaN or AlGaN nucleation layer, a stress buffer layer and a light emitting structure layer,
   wherein the stress buffer layer is disposed between the GaN or AlGaN nucleation layer and the light emitting structure layer, the stress buffer layer composed of insertion layers and buffer layers alternately, the epitaxial layer further comprising a first buffer layer, wherein the first buffer layer and the light emitting structure layer are configured to be sequentially grown on the GaN or AlGaN nucleation layer, and the preparation method further comprising the step of: etching off the patterned Si substrate by wet etching by using the $Al_2O_3$ coating as a barrier layer, and exposing a patterned $Al_2O_3$ coating.

2. The preparation method according to claim 1, characterized in that the GaN or AlGaN nucleation layer configured to be grown on the $Al_2O_3$ coating.

3. The preparation method according to claim 1, characterized in that the step S2 comprising: plating an Al layer on the patterned Si substrate, and then introducing oxygen ions to form the $Al_2O_3$ coating.

* * * * *